(12) United States Patent
Shahar et al.

(10) Patent No.: US 7,257,169 B2
(45) Date of Patent: Aug. 14, 2007

(54) DESERIALIZER

(75) Inventors: Boaz Shahar, Raanana (IL); Eyran Lida, Modiin (IL); Eyal Massad, Yaakov (IL)

(73) Assignee: Mysticom Ltd., South Netanya (IL)

( * ) Notice: Subject to any disclaimer, the term of this patent is extended or adjusted under 35 U.S.C. 154(b) by 755 days.

(21) Appl. No.: 10/320,774

(22) Filed: Dec. 16, 2002

(65) Prior Publication Data

US 2003/0165201 A1 Sep. 4, 2003

Related U.S. Application Data

(60) Provisional application No. 60/345,483, filed on Jan. 3, 2002, provisional application No. 60/341,525, filed on Dec. 17, 2001.

(51) Int. Cl.
*H03D 1/00* (2006.01)

(52) U.S. Cl. .......... 375/340; 370/366; 370/395.62; 370/503; 375/316; 375/355; 375/375; 375/376; 713/503

(58) Field of Classification Search .......... 341/100; 370/284, 315; 375/220, 226, 348, 355, 371, 375/316, 224; 716/6; 455/73
See application file for complete search history.

(56) References Cited

U.S. PATENT DOCUMENTS

| 4,333,143 A | | 6/1982 | Calder | |
|---|---|---|---|---|
| 4,376,309 A | * | 3/1983 | Fenderson et al. | 375/348 |
| 5,095,484 A | | 3/1992 | Karabed et al. | |
| 5,587,709 A | | 12/1996 | Jeong | |
| 5,950,115 A | * | 9/1999 | Momtaz et al. | 455/73 |
| 6,016,330 A | | 1/2000 | Ashley et al. | |
| 6,192,072 B1 | | 2/2001 | Azadet et al. | |
| 6,266,366 B1 | | 7/2001 | Greiss et al. | |
| 6,272,193 B1 | * | 8/2001 | Eglit | 375/355 |
| 6,307,906 B1 | * | 10/2001 | Tanji et al. | 375/376 |

FOREIGN PATENT DOCUMENTS

| WO | WO 97/01888 | 1/1997 |
|---|---|---|
| WO | WO 00/28691 | 5/2000 |
| WO | WO 01/52469 | 7/2001 |

OTHER PUBLICATIONS

Mueller and Muller, "Timing Recovery in Digital Synchronous Data Receivers", IEEE Transactions on Communications, pp. 516-531, vol. 24, May 1976.

(Continued)

*Primary Examiner*—David C. Payne
*Assistant Examiner*—Adolf DSouza
(74) *Attorney, Agent, or Firm*—Abelman, Frayne & Schwab

(57) ABSTRACT

A receiver for deserializing a stream of data bits, including a single clock which is adapted to generate a first plurality of clock phases, and a sample generator which is adapted to sample the stream so as to generate initial data values of each of the bits at times defined by the first plurality of clock phases.

The receiver further includes digital circuitry which is adapted to group the initial values into a second plurality of sampling phase sets, according to the clock phases at which the values were sampled, and assign each of the phase sets a respective grade in response to at least some of the initial values. The circuitry selects a decoding phase set from the phase sets in response to the respective grades, and decodes the stream in response to initial values of the decoding phase set to generate decoded values of the consecutive bits.

30 Claims, 12 Drawing Sheets

OTHER PUBLICATIONS

"8 to 10-bit/10 to 8-bit Data Conversion with Frame Disparity Generating/Checking", IBM Technical Disclosure Bulletin, IBM Corp. New York, vol. 34, No. 4A, Sep. 1991.

Tuukkanen, V et al, "Combined Interpolation and Maximum Likelihood Symbol Timing Recovery in Digital Receivers", 1997 IEEE 6th, International Conference on Universal Personal Communications Record, San Diego, Oct. 12-16, 1997, New York, USA. vol. 2, Conf. 6, pp. 698-702.

Bouttier A, "A Truly Recursive Blind Equalization Algorithm", Proceedings of the 1998 IEEE International Conference on Acoustics, Speech and Signal Processing. ICASSP '98, Seattle, vol. 6, Conf. 23, pp. 3381-3384.

* cited by examiner

FIG. 11
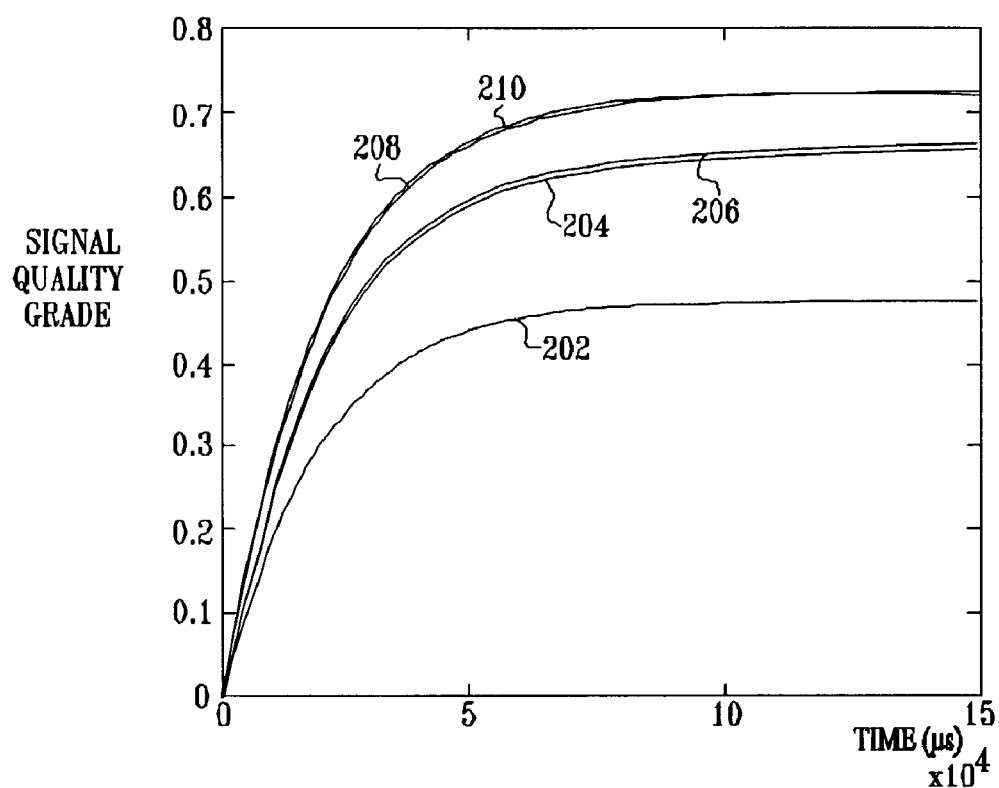
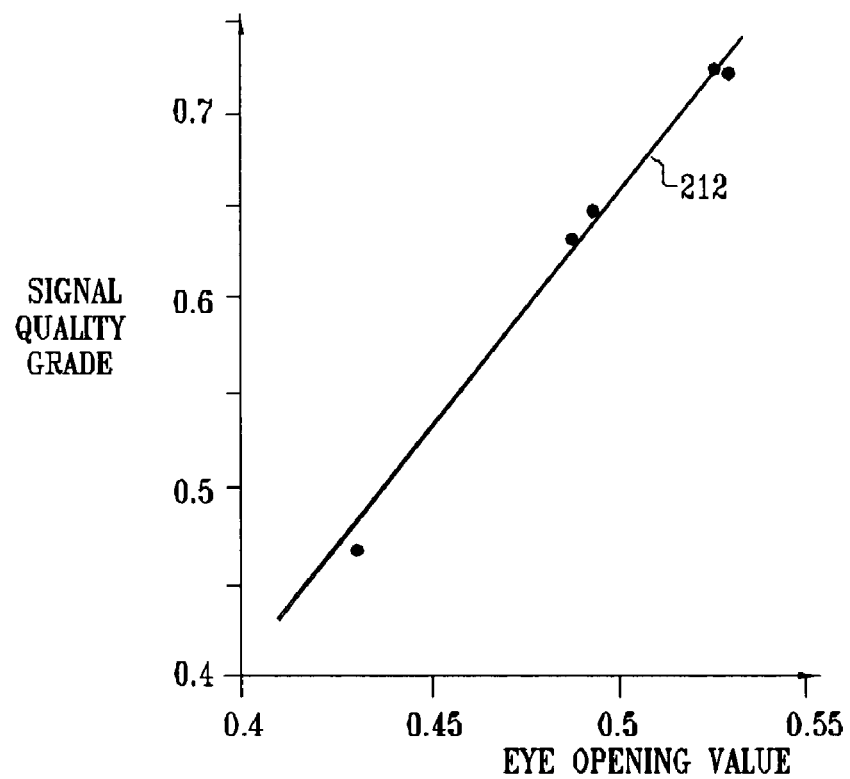

DESERIALIZER

CROSS-REFERENCE TO RELATED APPLICATIONS

This application claims the benefit of U.S. Provisional Patent Applications 60/341,525, filed Dec. 17, 2001 and 60/345,483, filed Jan. 3, 2002, which are incorporated herein by reference.

FIELD OF THE INVENTION

The present invention relates generally to data communication, and specifically to converting between serial and parallel data.

BACKGROUND OF THE INVENTION

Conversion of parallel data to serial data, termed serialization, and the converse operation, deserialization, are required for many data communication processes. The parallel data is generated on a bus, and is converted to serial data for transmission on one channel. As busses increase in width, typical busses having 64 lines or even more, the speed at which data which has been serialized needs to be transmitted must of necessity increase, to avoid data build-up at the serializer interface. Serial data rates of Gigabits/s are typically required to avoid the build-up. Multichannel SER-DES (serializer-deserializer) devices comprise multiple serializers each having a serializer interface. Each interface generates a channel of serial data which is then transmitted to a receiver.

Recovery of such high speed multichannel serialized data presents considerable problems at the receiver. In systems known in the art a clock is recovered for each channel of the received data, and each clock is used to sample the received data. Typically, each recovered clock is locked to its own phase locked loop (PLL) oscillator. Furthermore, multiple sampling PLL clocks require respective elastic buffers for storing the sampled data, and there is typically an extra PLL clock for synchronizing all the sampling clocks to a common local clock.

However, each PLL may suffer from its own jitter, since it is locked to incoming data; in addition, problems are caused by the multiplicity of PLL clocks. The PLL is a highly sensitive circuit, so that in layout of a device having PLLs, each PLL is, for example, isolated as much as possible and has its own ground and supply lines. Devices requiring multiple PLL oscillators thus require more area and more pins, and typically give lower yields because one PLL failure causes device failure.

Data which is initially in an 8-bit (8b) form is typically encoded at the transmitter into an alternative form so that errors in the received data may be detected. An IEEE standard 802.3z, published by the Institute of Electronic and Electrical Engineers, New York, N.Y., describes an 8b/10b coding scheme, originally developed by IBM Corporation. Using the scheme, a transmitter maintains a table having a one-to-two correspondence, so that each 8b word may be transmitted as one of two 10b words. Each 10b word in the table has between 4 and 6 ones (and correspondingly 6 and 4 zeroes). A partial list of 8b and corresponding 10b words, according to the scheme, is shown in Table I below.

TABLE I

| 8-bit word | Decimal value | First mapping B1 (RD−) | Second mapping B2 (RD+) | Running Disparity (RD) |
|---|---|---|---|---|
| 00000000 | 0 | 100111 0100 | 011000 1011 | same |
| 00000001 | 1 | 011101 0100 | 100010 1011 | same |
| 00000010 | 2 | 101101 0100 | 010010 1011 | same |
| 00000011 | 3 | 110001 1011 | 110001 0100 | switch |
| 00000100 | 4 | 110101 0100 | 001010 1011 | same |
| 00000101 | 5 | 101001 1011 | 101001 0100 | switch |
| 00000110 | 6 | 011001 1011 | 011001 0100 | switch |
| 00000111 | 7 | 111000 1011 | 000111 0100 | switch |
| 00001000 | 8 | 111001 0100 | 000110 1011 | same |
| 00001001 | 9 | 100101 1011 | 100101 0100 | switch |
| ... | ... | ... | ... | ... |
| 10111100 | 188 | 001110 1010 | 001110 1010 | same |
| 10111101 | 189 | 101110 1010 | 010001 1010 | switch |
| ... | ... | ... | ... | ... |
| 11000100 | 196 | 110101 0110 | 001010 0110 | switch |
| ... | ... | ... | ... | ... |
| 11100100 | 228 | 110101 0001 | 001010 1110 | same |
| ... | ... | ... | ... | ... |
| 11111111 | 255 | 101011 0001 | 010100 1110 | same |

A complete listing of Table I comprises 256 rows. As shown in Table I, each 8b word is mapped to one of two 10b words. The first mapping B1 comprises words having 5 or 6 ones. The second mapping B2 comprises words having 4 or 5 ones. In transmitting a string of 8b words, a transmitter calculates a total running disparity (RD) of the string—the difference between the total number of ones and the total number of zeroes transmitted. After each 10b word has been transmitted, the transmitter evaluates if RD is positive, negative, or zero. For RD+ the following 10b word is transmitted from the first mapping B1, and for RD− the following 10b word is transmitted from the second mapping B2. If RD is zero, the fourth column, stating whether the same mapping is used or if the mapping switches, is used. The transmitter is thus able to maintain the disparity of the transmitted string within the bounds of +1 and −1.

A receiver of the encoded data is able to use the disparity properties to detect if there are errors in the received data. Typically, the receiver calculates and updates a disparity status of the received string, and if this results in a value outside the bounds, the receiver knows that there is an error in the received data. Similarly, in receiving any two sequential 10b words, if the instruction in column four is violated, there is an error in the received data. However, in most cases the receiver is not able to know in exactly which received word the error occurred. Even if it does know the exact word, the receiver is not able to correct the error.

Performance of both data transmitters and data receivers is an important factor in their operation. One of the measurements of performance is signal quality, both transmitted signal quality and received signal quality. A method for measuring signal quality, known in the art, is by generating an "eye" pattern. The eye pattern may be generated in specialized equipment by repeatedly sampling the signal level and plotting the level on a vertical axis, while triggering a horizontal axis to a signal clock. A "perfect" signal would give a rectangle, and the quality of the actual signal is proportional to the "openness" of the eye pattern generated—the more open the center of the eye, the higher the signal quality.

The specialized equipment for generating eye patterns may be available in a facility where the transmitter and/or receiver are produced, so that adjustments to the transmitter and/or receiver may be made at the facility to improve signal quality. However, such signal quality measurements and adjustments to improve the quality may not be able to be made in an "on-site" situation, because of the lack of specialized equipment. There is thus a need for a signal quality indicator that overcomes these problems.

SUMMARY OF THE INVENTION

The present invention seeks to provide a multiple channel deserializer which uses a single phase locked loop (PLL) oscillator for data sampling and clock recovery. The sampling and clock recovery are performed substantially simultaneously in the digital domain. By using one PLL oscillator, the architecture of the multiple channel deserializer is considerably simplified.

In preferred embodiments of the present invention, a single free-running PLL oscillator comprised in the deserializer generates a plurality of clock phases. The deserializer receives data conveyed on one or more channels as respective streams of bits. For each stream, each bit is sampled at a number of the phases, and samples from a group of bits are combined into a plurality of sampling phase sets. The deserializer comprises, for each stream, a sensor for each of the sampling phase sets set, each sensor measuring the quality of its set of samples according to data values of the samples, and generating an initial grade for its set. Each sensor most preferably measures the quality of its set of samples by comparing values of its samples with values of samples having adjacent phases.

For each stream of bits, the set having a highest final grade, preferably determined after integrating consecutive initial grades, is used as a main sampling phase set, which in turn supplies the samples used for the deserializer output for the stream. Selection of the main sampling phase set effectively implements clock and data recovery (CDR) in the digital domain. By only requiring a single PLL for sampling data streams conveyed on one or more channels, the deserializer is able to operate in a robust and reliable manner, and may be implemented more efficiently than deserializers using multiple PLLS. Utilizing one PLL simplifies design constraints for the deserializer, and implementing digital CDR simplifies the overall digital design. Furthermore, there is no requirement that data received by the deserializer on multiple channels be clocked at the same frequencies.

In order to reduce sensitivity to high frequency inter-symbol-interference (ISI), occurring when a single high frequency bit occurs after a low frequency pattern, for each stream of bits the deserializer of the present invention preferably allows the main sampling phase set to be overwritten with a decision from one of the other phase sets only when there is a high likelihood that the main sampling phase set is incorrect.

There is further provided, according to a preferred embodiment of the present invention, a receiver for deserializing a stream of consecutive data bits, including:

a single clock which is adapted to generate a first plurality of clock phases;

a sample generator which is adapted to sample the stream so as to generate initial data values of each of the consecutive data bits at times defined by the first plurality of clock phases; and digital circuitry which is adapted to:

group the initial data values into a second plurality of sampling phase sets, according to the clock phases at which the values were sampled, assign each of the sampling phase sets a respective grade responsive to at least some of the initial data values, select a decoding phase set from the sampling phase sets responsive to the respective grades, and decode the stream responsive to the initial data values of the decoding phase set to generate decoded values of the consecutive bits.

Preferably, the single clock consists of a free-running clock driving a phase locked loop (PLL) oscillator having a period of oscillation substantially independent of the period of the consecutive data bits.

Preferably, the first plurality of phases have a substantially equal separation in time from each other, and the separation in time is an integral sub-multiple of a period of the data.

Preferably, the digital circuitry includes a second plurality of initial grading modules which each assign the respective sampling phase sets the respective grade, and the digital circuitry also includes a second plurality of integrator blocks which each receive an output from the respective initial grading modules, and which integrate the output over time, and the digital circuitry also includes a main phase selector which selects the decoding phase set as the sampling phase set having a highest value of the grade.

Preferably, the initial grading module includes a third plurality of substantially similar circuits, each circuit being implemented to determine a partial sum of the respective grade, and the partial sum is evaluated by a predetermined function receiving values generated by three or more consecutive bits included in the stream of consecutive bits.

Further preferably, the initial grading module sums the partial sum of each circuit to generate a temporal grade as an output of the module.

The digital circuitry preferably includes a single bit corrector which overwrites the decoded value of one of the consecutive bits responsive to the decoded value, and to at least one of the decoded values of the consecutive bit preceding the one of the consecutive bits, and the consecutive bit following the one of the consecutive bits.

The single bit corrector preferably overwrites the decoded value responsive to a comparison between the decoded value and the initial data value of the one of the consecutive bits determined at a phase different from the sampling phase set of the one of the consecutive bits.

Preferably, the digital circuitry includes a symbol alignment block which receives the decoded values of the consecutive bits and which is adapted to generate a symbol from the decoded values and to determine boundaries of the symbol.

There is further provided, according to a preferred embodiment of the present invention, a method for deserializing a stream of consecutive data bits, including:

sampling each of the consecutive data bits at times defined by a first plurality of clock phases generated by a single receiver clock so as to generate initial data values of each of the consecutive data bits;

grouping the initial data values into a second plurality of sampling phase sets, according to the clock phases at which the values were sampled;

assigning each of the sampling phase sets a respective grade responsive to at least some of the initial data values;

selecting a decoding phase set from the sampling phase sets responsive to the respective grades; and decoding the stream responsive to the initial data values of the decoding phase set to generate decoded values of the consecutive bits.

Preferably, the single receiver clock includes a free-running clock driving a phase locked loop (PLL) oscillator having a period of oscillation substantially independent of the period of the consecutive data bits.

Preferably, the first plurality of phases have a substantially equal separation in time from each other, and the separation in time is an integral sub-multiple of a period of the data.

Further preferably, assigning each of the sampling phase sets a respective grade consists of providing a second plurality of initial grading modules which each assign the respective sampling phase sets the respective grade.

The method preferably includes receiving an output from each of the respective initial grading modules and integrating the output over time.

Preferably, selecting the decoding phase set from the sampling phase sets includes selecting the decoding phase set as the sampling phase set having a highest value of the grade.

The method preferably includes determining a partial sum of the respective grade, and further preferably, determining the partial sum includes receiving values generated by three or more consecutive bits included in the stream of consecutive bits and evaluating the partial sum by a predetermined function responsive to the received values.

Preferably, the method includes summing the partial sums to generate a temporal grade.

The method preferably includes overwriting the decoded value of one of the consecutive bits responsive to the decoded value, and to at least one of the decoded values of the consecutive bit preceding the one of the consecutive bits, and the consecutive bit following the one of the consecutive bits.

Preferably, overwriting the decoded value includes overwriting the decoded value responsive to a comparison between the decoded value and the initial data value of the one of the consecutive bits determined at a phase different from the sampling phase set of the one of the consecutive bits.

The method further includes determining boundaries between symbols included in the decoded values.

There is further provided, according to a preferred embodiment of the present invention, a receiver for deserializing data conveyed on a first plurality of channels, consisting of:

a single clock which is adapted to generate a second plurality of clock phases; and a first plurality of deserializers, respectively coupled to the first plurality of channels so as to receive a respective data stream as consecutive data bits, each deserializer including:

a sample generator which is adapted to sample the respective data stream so as to generate initial data values of each of the consecutive data bits at times defined by the second plurality of clock phases; and digital circuitry which is adapted to:

group the initial data values into a third plurality of sampling phase sets, according to the clock phases at which the values were sampled, assign each of the sampling phase sets a respective grade responsive to at least some of the initial data values, select a decoding phase set from the sampling phase sets responsive to the respective grades, and decode the respective data stream responsive to the initial data values of the decoding phase set to generate decoded values of the consecutive bits.

Preferably, at least two of the first plurality of data streams have different clocks.

Further preferably, one of the deserializers includes the single clock.

Preferably, each of the first plurality of deserializers is adapted to generate a first plurality of symbols from the decoded values.

There is further provided, according to a preferred embodiment of the present invention, a method for deserializing data conveyed on a first plurality of channels, including:

generating a second plurality of clock phases from a single clock;

conveying the second plurality of clock phases to a first plurality of deserializers; and coupling the first plurality of deserializers to the first plurality of channels so as to receive therefrom a respective data stream as consecutive data bits, each deserializer including:

a sample generator which is adapted to sample the respective data stream so as to generate initial data values of each of the consecutive data bits at times defined by the second plurality of clock phases, and digital circuitry which is adapted to:

group the initial data values into a third plurality of sampling phase sets, according to the clock phases at which the values were sampled, assign each of the sampling phase sets a respective grade responsive to at least some of the initial data values, select a decoding phase set from the sampling phase sets responsive to the respective grades, and decode the respective data stream responsive to the initial data values of the decoding phase set to generate decoded values of the consecutive bits.

Preferably, at least two of the first plurality of data streams have different clocks.

Preferably, one of the deserializers includes the single clock.

The method preferably includes each of the first plurality of deserializers generating a first plurality of symbols from the decoded values.

The present invention will be more fully understood from the following detailed description of the preferred embodiments thereof, taken together with the drawings, in which:

BRIEF DESCRIPTION OF THE DRAWINGS

FIG. 11 shows schematic graphs of values of the final signal quality grade from the SQI of FIG. 9, for different input signals, according to a preferred embodiment of the present invention.

DETAILED DESCRIPTION OF PREFERRED EMBODIMENTS

Figure 1:
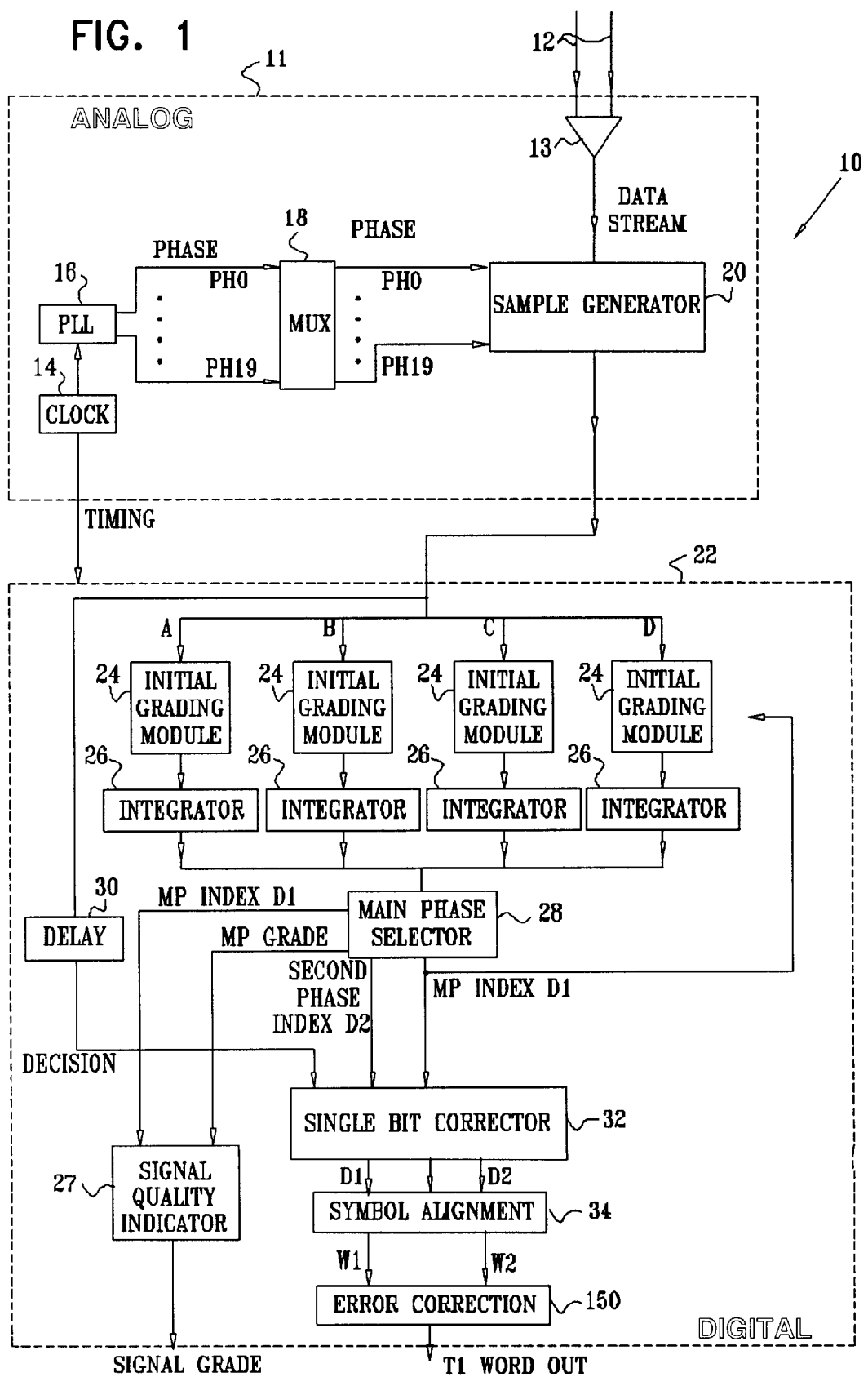
FIG. 1 is a schematic block diagram of a deserializer, according to a preferred embodiment of the present invention.
Figure 2:
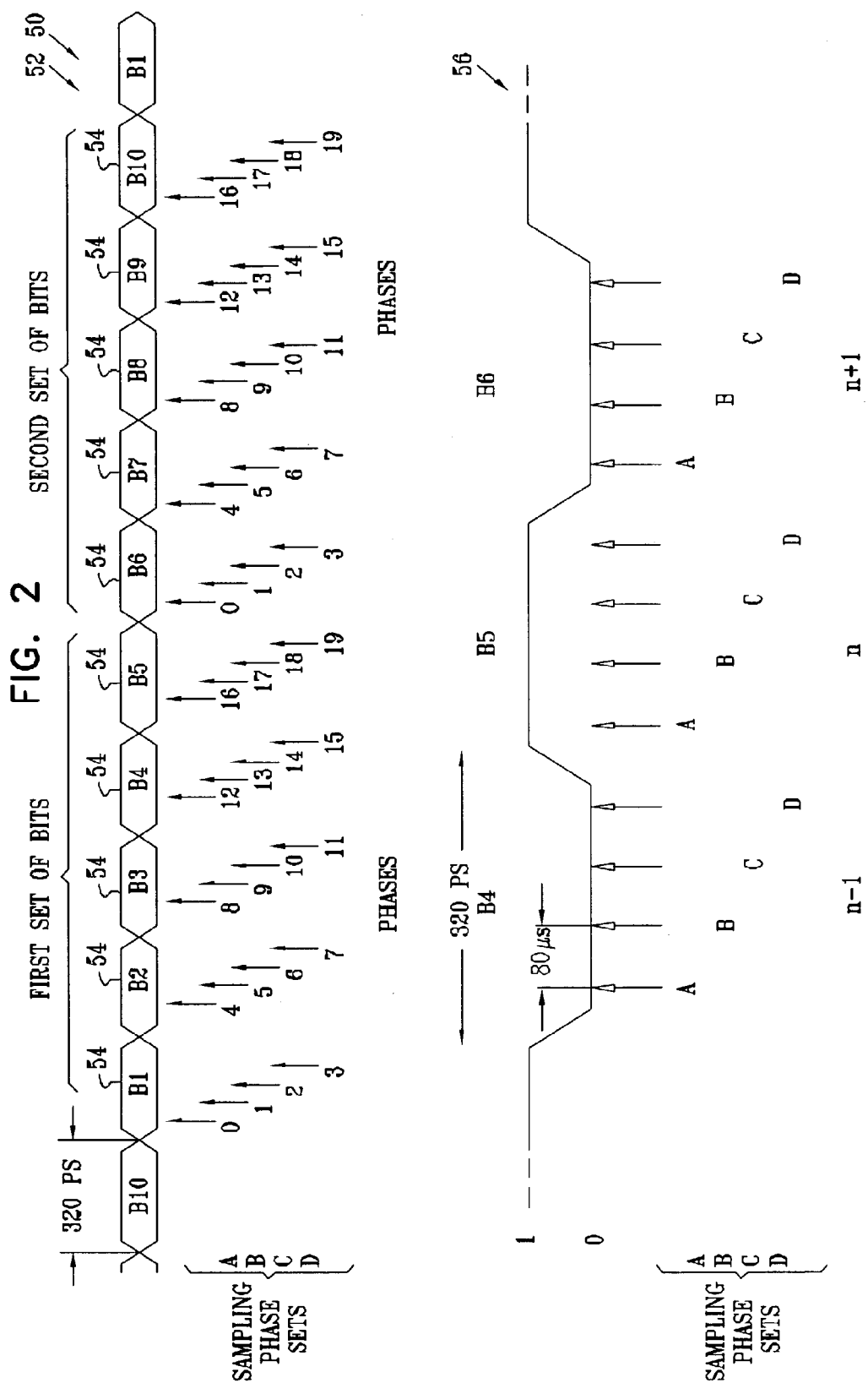
FIG. 2 are schematic graphs of data received by the deserializer of FIG. 1, according to a preferred embodiment of the present invention.

Reference is now made to FIG. 1, which is a schematic block diagram of a deserializer 10, and to FIG. 2, which comprises schematic graphs of data received by the deserializer, according to a preferred embodiment of the present invention. In an analog front end 11, deserializer 10 receives incoming serial data which may be transmitted according to substantially any serial data protocol. Hereinbelow, by way of example, the data is assumed to be transmitted in the form of 8b/10b encoded data according to IEEE standard 802.3z, as described in the Background of the Invention. The data is received on a channel, herein assumed to comprise two differential lines 12, although it will be understood that the channel may not comprise differential lines.

The data is combined in an input cell 13 as a single data stream 50 of bits 54, as shown in a graph 52 (FIG. 2), and the single bit stream is fed to a sample generator 20. Bits 54 are also referred to herein as bits B1, B2, ..., B10. A section of graph 52 is shown in more detail in a graph 56. Data stream 50 is assumed to be transmitted at 3.125 Gb/s, so that each bit 54 of stream 50 has a nominal width of 320 ps. However, it will be appreciated that the transmission rate and nominal width are examples, and that substantially any transmission rate and bit width may apply to the data received.

A free-running reference receive clock 14 driving a phase-locked loop (PLL) oscillator 16 generates a base frequency of 625 MHz. The 625 MHz base frequency is used to generate 20 substantially equally spaced phases, ph0, ph1, ..., ph19 which are separated by 80 ps. The phases are input to a multiplexer 18, and contiguous phases from the multiplexer are used to sample bits 54 in sample generator 20. Sample generator 20 effectively acts as a slicer, providing a decision of 0 or 1 at each sample point.

As shown in graph 52, the 20 phases are used to sample a first set of five bits {B1, B2, B3, B4, B5}, and are also used to sample a second set of five bits {B6, B7, B8, B9, B10 }, each bit being nominally sampled at four positions. Generator 20 thus generates a total of forty samples in a cycle defined by the ten bits. The samples are provided in the form of respective decisions which are transferred to a digital circuitry section 22, which also receives general timing signals derived from clock 14 and/or PLL oscillator 16. It will be appreciated that the separation of 80 ps is a fourth of the period of the nominal width. It will also be appreciated that the separation of 80 ps is chosen by way of example, and that the phases may be separated by substantially any integral sub-multiple of the nominal width, the number of decisions generated by generator 20 altering accordingly.

In digital circuitry 22 the forty decisions are grouped into four sampling sets A, B, C, D. Referring to FIG. 2, first set A comprises ten decisions—two decisions for each phase—generated by phases {ph0, ph4, ph8, ph12, ph16 }. Sets B, C, and D respectively comprise ten decisions having phases {ph1, ph5, ph9, ph13, ph17 }, {ph2, ph6, ph10, ph14, ph18 }, and {ph3, ph7, ph11, ph15, ph19 }. Each sampling set is fed through one of four substantially similar initial grading modules 24. Each module 24 determines a quality of its respective sample set as a temporal grade, by comparing values of a present decision with values of adjacent decisions. The initial grades generated in each module 24 are integrated in respective leakage integrators 26, and the integrated grades are used in a main phase selector 28, as is described in more detail hereinbelow, to determine an optimal sampling set from amongst sampling sets A, B, C, D. Both the integrated grades supplied to main phase selector 28, and a grade determined by the selector, are thus determined by averaging decisions of more than one phase or phase set.

The optimal sampling set, together with the original decisions, are processed in a single bit corrector 32 wherein errors that may be caused by a "high frequency" single bit occurring within a "low frequency" pattern are eliminated. Bits from corrector 32 are processed through a symbol alignment block 34, wherein symbols input to deserializer 10 are recovered. Symbols from deserializer 10 are preferably output via an error correction block 150. Corrector 32 and blocks 34 and 150 are also described in more detail below. Most preferably, main phase selector 28 also provides outputs which are used as inputs to a signal quality indicator 27, preferably comprised in deserializer 10, and described with reference to FIGS. 8, 9, and 10 below.

Figure 3:
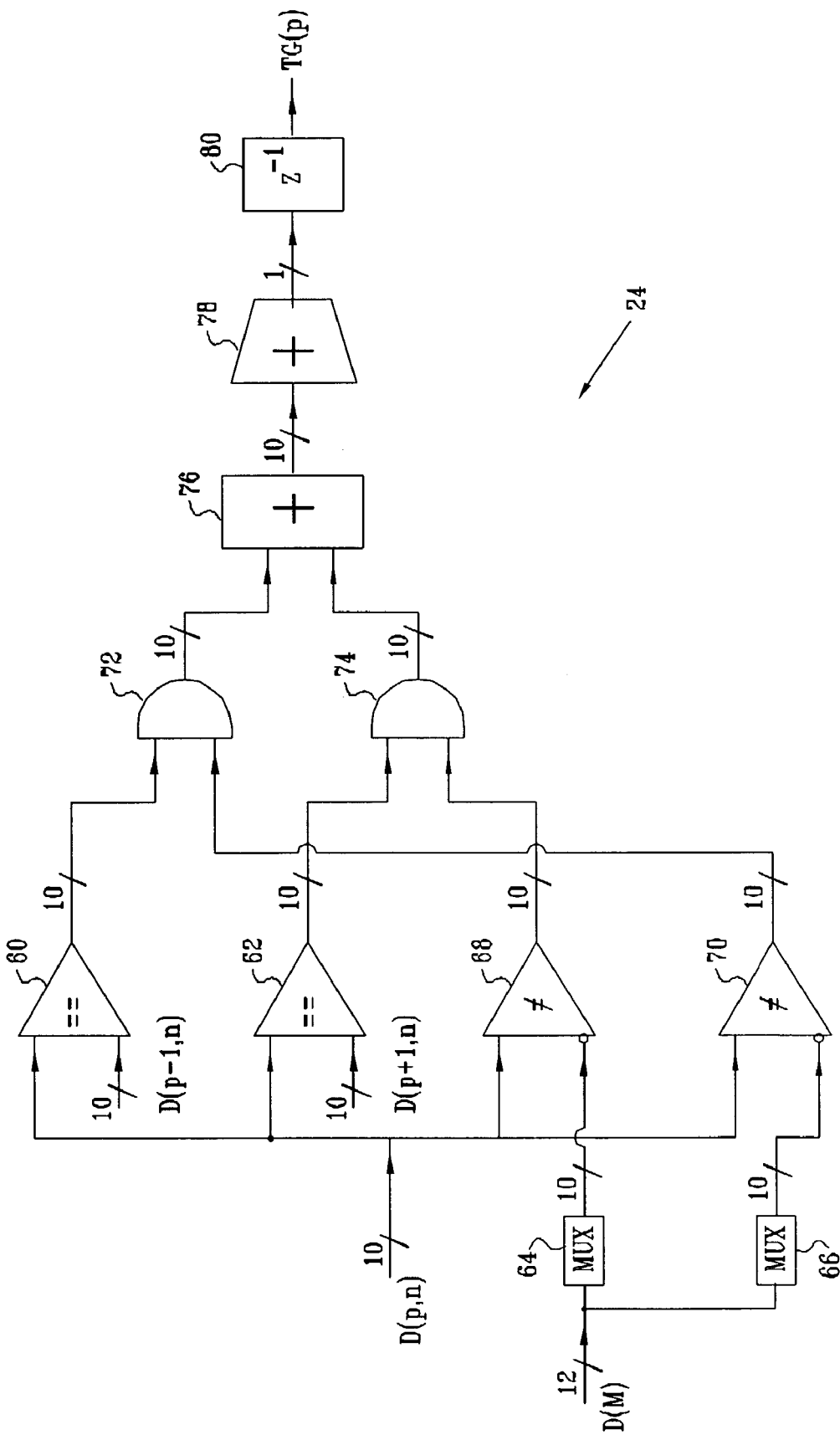
FIG. 3 is a schematic block diagram of an initial grading module, according to a preferred embodiment of the present invention.

FIG. 3 is a schematic block diagram of one of initial grading modules 24, according to a preferred embodiment of the present invention. Each module 24 operates in parallel on the ten decisions of its sampling set, so that elements 60, 62, 68, 70, 72, 74, and 76, in the module are replicated ten times. Elements 60 and 62 respectively comprise comparators, and are herein referred to as comparators 60 and 62; elements 68 and 70 respectively comprise XOR gates, and are herein referred to as gates 68 and 70; elements 72 and 74 respectively comprise AND gates, and are herein referred to as gates 72 and 74; element 76 comprises a summer and is herein referred to as summer 76.

Comparator 60 compares a decision value D(p,n), for a bit n, of the present phase p with a decision value D(p−1,n) of a phase prior to the present phase. The output of comparator 60 is a first input to AND gate 72. Comparator 62 compares decision value D(p,n) of the present phase with a decision value D(p+1,n) of a phase after the present phase. The output of comparator 62 is a first input to AND gate 74.

Module 24 also comprises selectors 64 and 66, which receive 12 decision values D(M) of a main phase M. Generation of main phase M is described in more detail below. Selector 64 selects ten decision values D(M,n+1), corresponding to main phase decisions of a bit after bit n, and outputs the selected decisions as a first input of XOR gate 68. Selector 66 selects ten decision values D(M,n−1), corresponding to main phase decisions of a bit before bit n, and outputs the selected decisions as a first input of XOR gate 70. The result of gate 68 provides a second input to gate 74, and the result of gate 70 provides a second input to gate 72.

The respective outputs of gates 72 and 74 are summed in summers 76. Summers 76 thus output ten separate values, herein termed partial sums $PS_n$, for each of the ten bits considered in stream 50. The ten values $PS_n$ are summed in a second summer 78 to give one value, which is delayed in a delay 80 before outputting a temporal grade TG(p) for present phase p from initial grading module 24.

The output of each module 24 may be represented by the following equation:

$$TG(p) = \sum_{n=1}^{n=10} PS_n \qquad (1)$$

$$= \sum_{n=1}^{n=10} \left\{ \begin{array}{l} (D(M, n-1) \neq D(p, n)) \oplus (D(p, n) = D(p-1, n)) + \\ (D(M, n+1) \neq D(p, n)) \oplus (D(p, n) = D(p+1, n)) \end{array} \right\}$$

where

TG(p) is the temporal grade of phase p,

D(M,n) is the decision of the main phase M for bit n,

D(p,n) is the decision of phase p for bit n, p+1, p−1 are respectively next and prior phases to phase p, and n+1, n−1 are respectively next and prior bits to bit n.

Each module 24 compares sample decisions of three consecutive bits, (n−1, n, n+1, where n=1, ..., 10). The ten results of these comparisons are summed, as shown by equation (1), in order to grade each of the sampling phase sets.

Graph 56 illustrates the summation. In graph 56 bits B4, B5, and B6 are respectively assumed to have the values 0, 1, and 0, and n has the value 5.

Assume M=A, so that p=12, 16 and 0 for bits B4, B5, and B6.

From graph 56,

D(M,n−1)=0

D(p,n)=1

D(p−1,n)=0

D(M,n+1)=0

D(p+1,n)=1

Thus $PS_5$ for sampling set A, herein termed $PS_{5A}$, is given by:

$$PS_{5A} = (0 \neq 1) \oplus (1=0) + (0 \neq 1) \oplus (1=1) = 1 \qquad (2)$$

Assume M=B, so that p=13, 17 and 1 for bits B4, B5, and B6.

Then,

D(M,n−1)=0

D(p,n)=1

D(p−1,n)=1

D(M,n+1)=0

D(p+1,n)=1

Thus $PS_{5B}$ is given by:

$$PS_{5B} = (0 \neq 1) \oplus (1=1) + (0 \neq 1) \oplus (1=1 = 2 \qquad (3)$$

Assume M=C, so that p=14, 18 and 2 for bits B4, B5, and B6.

Then,

D(M,n−1)=0

D(p,n)=1

D(p−1,n)=1

D(M,n+1)=0

D(p+1,n)=1

Thus $PS_{5C}$ is given by:

$$PS_{5C} = (0 \neq 1) \oplus (1=1) + (0 \neq 1) \oplus (1=) = 2 \qquad (4)$$

Assume M=D, so that p=15, 19 and 3 for bits B4, B5, and B6.

Then,

D(M,n−1)=0

D(p,n)=1

D(p−1,n)=1

D(M,n+1)=0

D(p+1,n)=0

Thus $PS_{5D}$ is given by:

$$PS_{5D} = (0 \neq 1) \oplus (1=1) + (0 \neq 1) \oplus (1=0) = 1 \qquad (5)$$

Each initial grading module 24 evaluates ten partial sums $PS_n$, by using a total of forty samples from the ten bits being processed by the modules. As shown by equation (1), the evaluation compares values generated by three consecutive bits (n−1, n, n+1). It will be appreciated that in order to evaluate the first bit (n=1) of a specific group of ten bits, values for the tenth bit of the preceding group are required for the evaluation. Similarly, to evaluate the tenth bit of the specific group, values for the first bit of the following group are required for the evaluation. The total of 48 samples of the twelve bits are stored in multiplexers 64 and 66.

Performing similar calculations to equations (2)-(5) for all bits and assuming the bits alternate sequentially in value between 0 and 1, gives results for TG(p) as shown in Table II below.

TABLE II

| Phase p | TG (p) |
|---------|--------|
| A | 10 |
| B | 20 |
| C | 20 |
| D | 10 |

Temporal grades TG(p) form a basis for deserializer 10 to decide which sampling phases to use in evaluating bits {B1, ..., B10}. As is apparent from Table II, phases which are closer to transitions between values, i.e., phase A and D in the table, receive substantially lower grades than phases which are farther from the transitions, i.e., phases B and C. The calculations of grades thus enable the deserializer to select a sampling phase furthest from transitions between values. The selected sampling phase, also herein termed the main phase, is used by the deserializer as a decoding phase, i.e., as an optimal phase at which bits 54 are to be decoded.

It will be understood that while the examples above with reference to the graphs of FIG. 2 have used substantially ideal values, the principles of grading incoming bits as described hereinabove apply to non-ideal received bits. In the case of non-ideal bits, deserializer 10 continuously grades the bits and determines a highest grade G from amongst three adjacent phases, as is shown in equation (7) below. Except when there is a change in phase, it will be appreciated that the highest grade phase, i.e. the main phase, will be the "center" of the three graded phases. When there is a change in main phase, then for one cycle the highest graded phase will be one of the non-central graded phases.

The resultant TG(p) of each initial grading module 24 is integrated in a respective leakage integrator 26.

Figure 4:
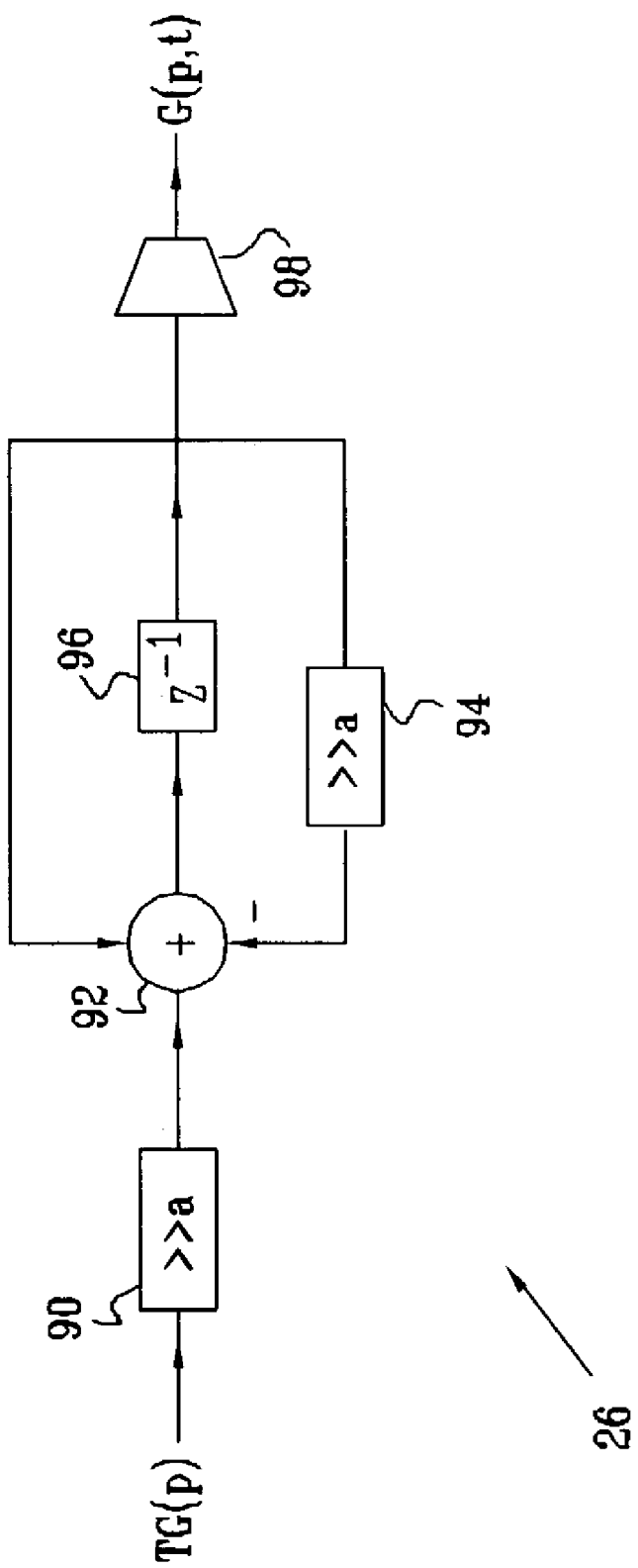
FIG. 4 is a schematic block diagram of a leakage integrator, according to a preferred embodiment of the present invention.

FIG. 4 is a schematic block diagram of leakage integrator 26, according to a preferred embodiment of the present invention. Each integrator 26 performs a weighted time integration of the value TG(p) received from its respective initial grading module 24. TG(p) is input to a shifter 90, which shifts the value of TG(p) to the right by a predetermined number, preferably 2. The output of shifter 90 is a first input to a summer 92. The output of summer 92 is passed through a register 96 acting as a time delay, and the output of register 96 is fed back directly to the summer. The output of register 96, after being shifted right by the predetermined number in a shifter 94, is also subtracted in summer 92. The output from the integrator, after being adjusted in a fixed point converter 98, is represented by the following equation:

$$G(p,t)=G(p,t-1)-G(p,t-1)>>a+TG(p)>>a \qquad (6)$$

where

G(p,t) is the final grade of phase p at a time t, and a is the predetermined shifted right value.

Each of the four final grades is input to a main phase selector 28 (FIG. 1). In each cycle of the 625 MHz clock selector 28 selects a main phase M(t+1) for a next cycle by finding a highest grade G from three adjacent phases of the present cycle, as shown in the following equation:

$$M(t+1)=\text{Max}[G(M,t),G(M-1,t),G(M+1,t)] \qquad (7)$$

The selected main phase M(t+1) is used, as shown in equation (1), as an input for determining the partial sums $PS_n$. Preferably, if there is no clear-cut maximum in equation (7), G(M,t) is assumed to be the maximum value.

Returning to FIG. 1, an index D1 of main phase M and an index D2 of a second phase, the second phase having a grade closest to main phase M, are transferred from main phase selector 28 to single bit corrector 32. Corrector 32 also receives decisions from sample generator 20, via a delay 30. Corrector 32 uses the phase indices and decisions corresponding to main phase M to allow a decision made by the main phase to be overwritten in predetermined situations, usually caused by inter-symbol interference (ISI). Typically, ISI is most troublesome when a single bit value is different from a train of bits on either side of the single bit, for example 1111110111. Most preferably, a main phase decision is overwritten if the following condition is true:

$$((D(M,n-1)=D(M,n)=(D(M, n+1))\oplus(D(p,n)\ne D(M,n))) \qquad (8)$$

where p may be M−1 or M+1.

Condition (8) is true if three consecutive main phase decisions are the same, and if the central main phase decision is not the same as a phase on either side of the central main phase. The latter typically occurs if the main phase "missed" a transition. If condition (8) is not true, the decision of the main phase is not overwritten.

Figure 5:
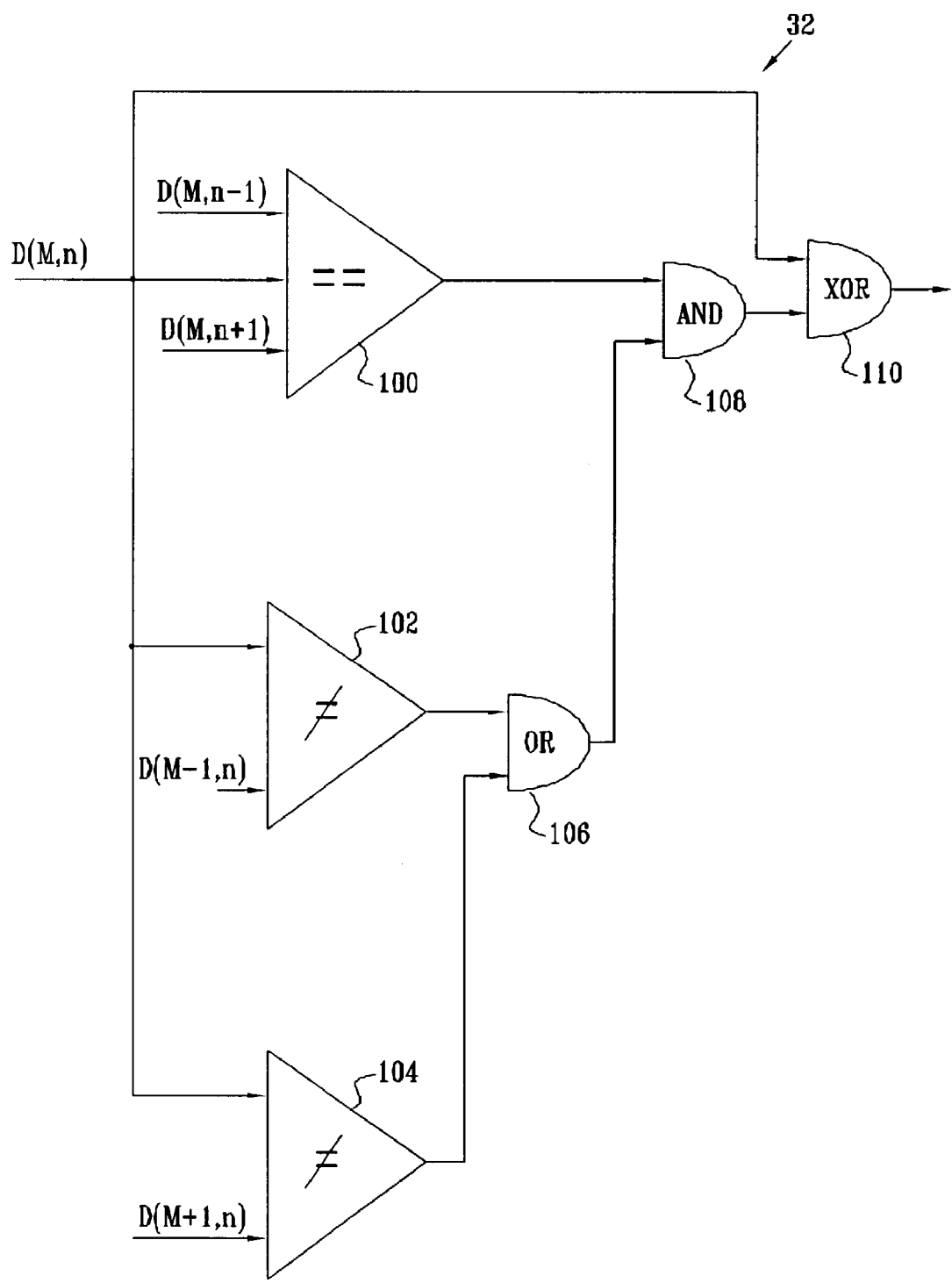
FIG. 5 is a schematic block diagram of a single bit corrector, according to a preferred embodiment of the present invention.

FIG. 5 is a schematic block diagram of single bit corrector 32, according to a preferred embodiment of the present invention. Correctors substantially similar to single bit corrector 32 are most preferably implemented in parallel, the number of correctors preferably corresponding to ten. Corrector 32 comprises a comparator 100 which checks for equality of decisions D(M,n−1), D(M,n), and D(M,n+1). The decisions are received via delay 30. The output of comparator 100 is a first input to an AND gate 108. Two other substantially similar comparators 102, 104 check respectively for inequality of decisions D(M−1,n) and D(M, n), and decisions D(M+1,n) and D(M,n), which are also received via delay 30. D(M,n) corresponds to main phase index D1, and either D(M+1,n) or D(M−1,n) correspond to second phase index D2. The decision D(M+1,n) or D(M−1,n) which does not correspond to D2 represents a third phase decision, on the opposite side of the main phase from D2. The outputs of comparators 102 and 104 are transferred to an OR gate 106, which generates a second input to AND gate 108. The output of AND gate 108, corresponding to equation (8), is exclusively ORed in a gate 110 to decide if main decision D(M,n) is to be overwritten.

It will be appreciated that since the frequency of receiver clock 14 and the effective frequency of the received bits may not be identical, there may typically be drift between the sampling positions generated by the clock and the received bits. Typically, there is a standard number of bits resolved per cycle, the standard in the examples described above being ten; the drift will cause, for one cycle, typically the cycle when there is a change in main phase, resolution of one extra bit or one less bit in the cycle compared to the standard number of bits resolved. Thus corrector 32 may output, in each cycle of the receiver clock, 9, 10, or 11 bits.

Decisions from corrector 32 for phase index D1, as well as decisions for phase D2, are transferred to symbol alignment block 34 which temporarily stores the decisions as sets of D1 decisions and sets of D2 decisions. Bits 52 are preferably transmitted as symbols, also termed words, formed according to a predetermined coding scheme, most preferably the 8b/10b word coding scheme described in the Background of the Invention. Block 34 analyzes the stored values to determine boundaries between symbols, by methods which are well known in the art, and outputs the symbols evaluated. Typically one symbol formed from the D1 decisions, herein termed W1, is output per cycle, but it will be appreciated that in a generally similar manner to corrector 32 outputting one extra or one less bit per cycle, alignment block 34 may be able to resolve and output 0, 1, or 2 symbols per cycle. A second symbol, formed from the D2 decisions and herein termed W2, is also output from block 34. Symbols W1 and W2 are also termed candidate words hereinbelow. It will be appreciated that, since its bits are derived from main phase decisions, W1 has a significantly higher probability of being correct than W2, which is derived from second phase decisions. The property of the difference in probability, generated by assigning a main phase and a second phase for each bit, is used in error correction block 150.

As outlined in the Background of the Invention, encoding 8b words to 10b words enables errors in reception of the 10b words to be detected.

Table III below shows how the errors introduced by an incorrect single bit in the 10b word may be classified.

TABLE III

| No. | Class Description |
| --- | --- |
| 1 | The 10b word is invalid i.e., it is not present in mapping B1 or B2, Table I. |
| 2 | The 10b word belongs to an incorrect mapping, according to the disparity status of a string of 10b words already received. |
| 3 | The 10b word belongs to a correct mapping, but causes the string to expect a disparity switch when no switch should occur. |
| 4 | The 10b word belongs to a correct mapping, but causes the string not to expect a disparity switch when such a switch should occur. |

Block 34 is most preferably implemented so as not to output 10b words in classification 1. Preferred embodiments of the present invention are implemented to correct errors in classifications 2, 3, and 4, as described hereinbelow.

Figure 6:
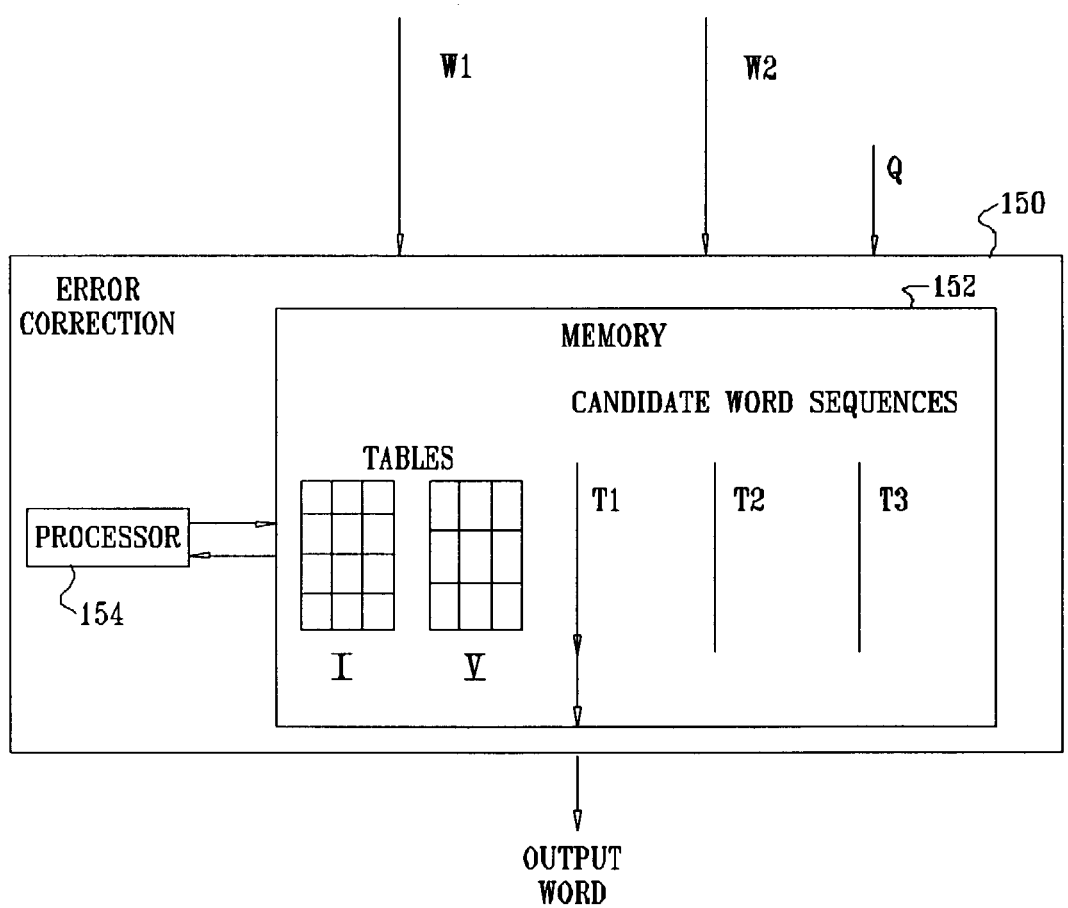
FIG. 6 is a schematic block diagram illustrating an error correction system, according to a preferred embodiment of the present invention.

FIG. 6 is a schematic block diagram illustrating an error correction system, according to a preferred embodiment of the present invention. W1 and W2 are input to error correction block 150, which recovers errors in the 8b/10b words it receives. It will be appreciated that block 150 may be implemented to recover errors generated by transmission of other types of encoded signals which have redundancy.

Block 150 maintains a multiplicity of sequences of previously transmitted candidate words Wx(t), Wx(t−1), . . . , Wx(t−N+1), where x may be 1 or 2, and where N is the number of words W1, W2 comprised in each sequence. The sequences are stored in a memory 152 in correction block 150. Herein, by way of example, the number of sequences is assumed to be three, and the sequences, also herein termed tracks, are referred to as T1, T2, and T3. Except as described below, track T1 in general receives W1, and track T2 in general receives W2. T1 is assumed to be a preferred track, and gives a final output from block 150. T2 is assumed to be a less preferred track. Track T3 is used as a reserve track.

A processor 154 in block 150 calculates a running disparity (RD) of each sequence, determining if the disparity status is positive, zero, or negative. Disparity and running disparity, and the concept of a transmitter generating strings of 10b words having their RD maintained within bounds, are described in more detail in the Background of the Invention.

As shown in Table III, errors may be classified as class 2, 3, or 4. A class 2 error is immediately apparent, assuming there are no prior errors in the string to which the word is being inserted. A class 3 or 4 error may not be immediately apparent, but eventually causes a disparity error similar to class 2. Processor 154 accommodates the differing errors by copying tracks T1, T2, and T3 to each other, and by assigning W1 and W2 to the tracks, so as to maintain T1 as the preferred track with the highest probability of having correct words in the track.

As candidate words W1 and W2 are generated, processor 154 checks if the candidate words "fit" the sequences, updates the sequences, and inserts W1 and W2 into the updated sequences according to the most probably correct arrangement.

For example, if W1 fits T1, W2 fits T2, but neither fit T3, T1 is first copied to T3 since T1 is more probably correct than T2. W1 is then inserted to T1 and T3, and W2 is inserted to T2. If W1 or W2 fit T3, no tracks are copied, W1 is inserted to T1, W2 is inserted to T1, and either W1 or W2 is inserted to D3, depending which of W1, W2 fits T3. If both W1, W2 fit T3, then W1 is inserted to T3, since W1 is more probably correct than W2. (This example is also considered with reference to Table V below.)

Figure 7:
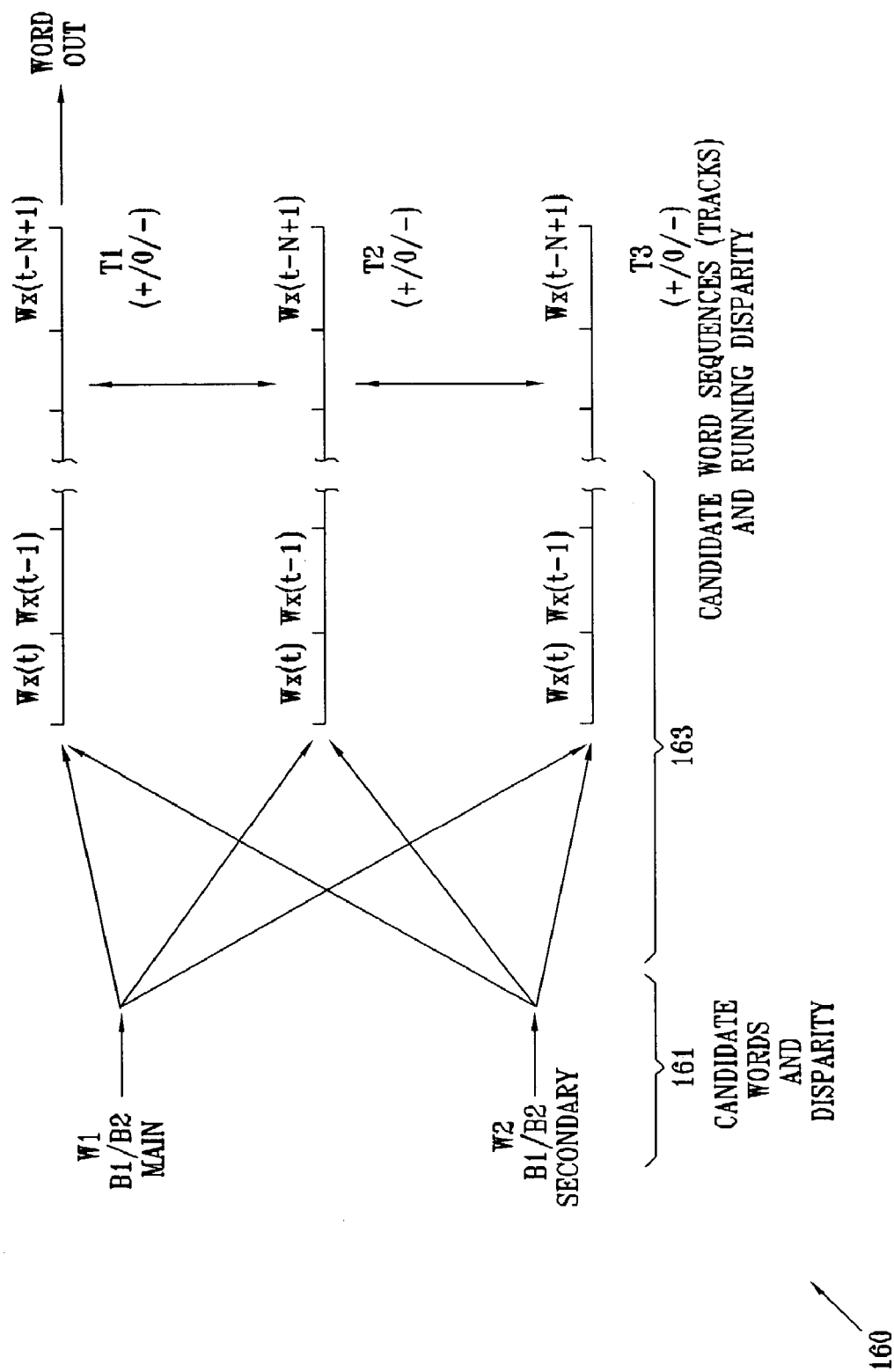
FIG. 7 is a logical flow diagram which schematically illustrates a process carried out by the error correction system of FIG. 6, according to a preferred embodiment of the present invention.
Figure 8:
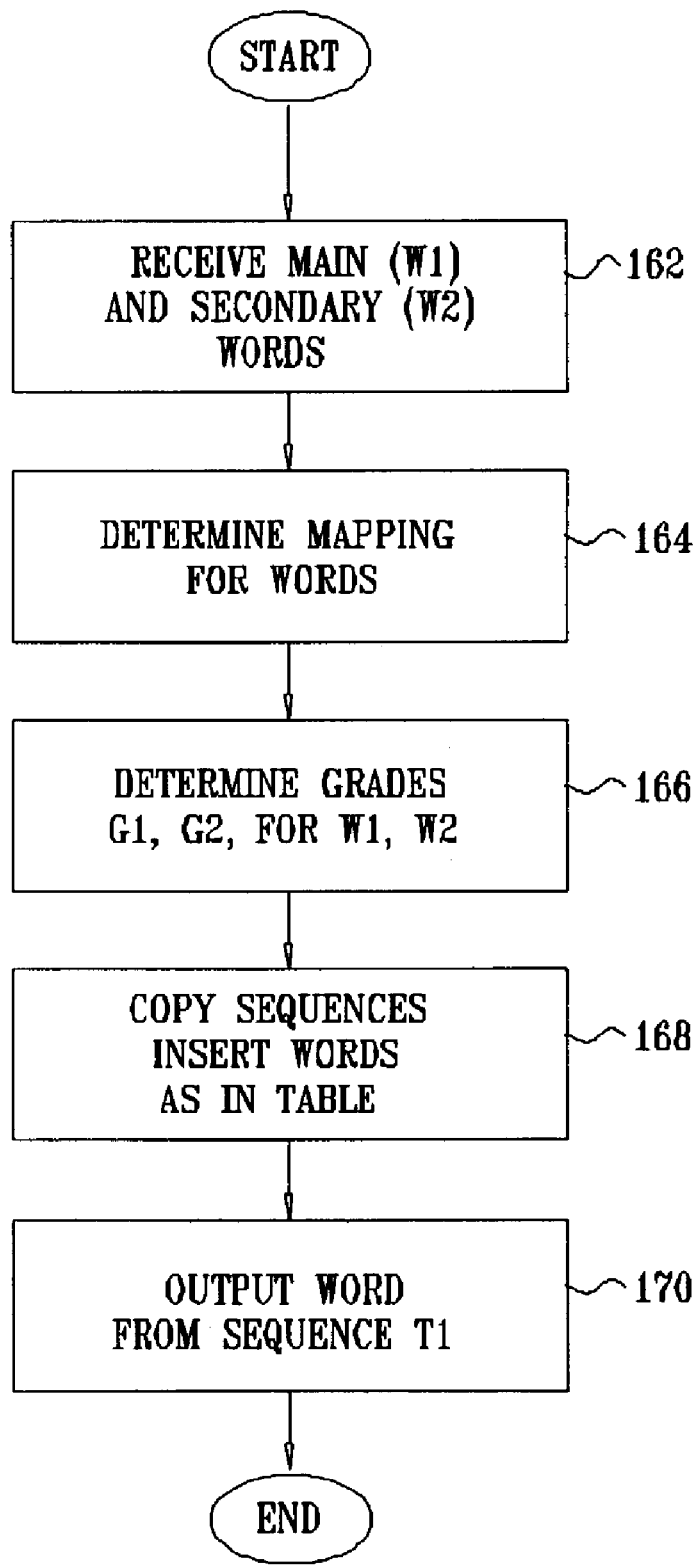
FIG. 8 is a flowchart showing steps in the process of FIG. 7, according to a preferred embodiment of the present invention.

FIG. 7 is a schematic diagram illustrating stages in a process 160 operated by error correction block 150, and FIG. 8 is a flowchart for the process, according to a preferred embodiment of the present invention. Process 160 is applied by processor 154 to each candidate word as it is received from symbol alignment block 34.

In a first step 162 of the process, corresponding to a first stage 161, processor 154 receives the two possible candidate words W1 and W2. Except for the case of W1=W2 words W1 and W2 may differ by one or more bits, the probability of a specific number of bits difference decreasing as the number increases. In most cases of a difference existing, the difference is one bit. Examples of possible pairs of words differing by one bit (derived from Table I) are given in Table IV below. The "difference" bit is underlined for each 10b word.

TABLE IV

| Position in Table I | W1/W2 |
| --- | --- |
| Decimal 0, Second mapping | 011000 1011 |
| Decimal 6, First mapping | 011001 1011 |
| Decimal 188, First mapping | 001110 1010 |
| Decimal 189, First mapping | 101110 1010 |
| Decimal 196, Second mapping | 001010 0110 |
| Decimal 228, Second mapping | 001010 1110 |

In a second step 164, processor 154 utilizes Table I, stored in memory 152, to determine to which mapping, B1 or B2, each word W1 and W2 belongs.

In a third step 166, for each W1, W2 word received in step 162, processor 154 determines a respective grade G1, G2. The grade is an ordered triple (Fit T3, Fit T2, Fit T1), each element of the triple comprising a binary value of 0 or 1. A "1" indicates a "fit," i.e., that the word may be inserted into the respective track T1, T2, or T3, without an error being apparent in the updated track. A "0" indicates a "no-fit," i.e., that inserting the word would generate an error in the track. For example a grade (0,1,1) assigned to W1 means that W1 does not fit track T3, but does fit tracks T2 and T1. If W1=W2 then G2 is automatically allocated the value (0,0, 0).

It will be appreciated that a fit does not necessarily mean that a sequence with the inserted word has no erroneous words. A sequence after the word has been inserted may comprise a "hidden" error corresponding to a category 3 or 4 error. The error may be in the inserted word, or in a word further back in the sequence. Similarly, a no-fit does not necessarily mean that the word being inserted has an error. The no-fit may also be the result of a sequence having a hidden category 3 or 4 error.

In a fourth step 168, corresponding to a second stage 163, processor 154 uses Table V below to assign which tracks replace each other, and also into which tracks words W1 and W2 are inserted. Table V is stored in memory 152. In the table T1→T2 means that track T1 is copied to track T2, W1→T1 means that W1 is inserted to the head of track T1. It will be understood that entries in the table such as

*T1* → *T2*

*T2* → *T1* mean that the track initially labeled T1 is copied to T2, and the track initially labeled T2 is copied to T1, so that in this case the tracks essentially switch labels. Processor 154 copies the tracks, with their running disparity, as indicated in the table.

TABLE V

| G1 | G2=000 | G2=001 | G2=010 | G2=011 | G2=100 | G2=101 | G2=110 | G2=111 |
|---|---|---|---|---|---|---|---|---|
| 000 | | T1 → T2<br>T1 → T3 | T2 → T1<br>T2 → T3 | T1 → T3 | T3 → T1<br>T3 → T2 | T1 → T2 | T2 → T1 | |
| | W1 → T1<br>W1 → T2<br>W1 → T3 | W2 → T1<br>W2 → T2<br>W2 → T3 | W2 → T1<br>W2 → T2<br>W2 → T3 | W2 → T1<br>W2 → T2<br>W2 → T3 | W2 → T1<br>W2 → T2<br>W2 → T3 | W2 → T1<br>W2 → T2<br>W2 → T3 | W2 → T1<br>W2 → T2<br>W2 → T3 | W2 → T1<br>W2 → T2<br>W2 → T3 |
| 001 | T1 → T2<br>T1 → T3 | T1 → T2<br>T1 → T3 | T1 → T3 | T1 → T3 | T3 → T2<br>T1 → T3 | T1 → T2 | | T1 → T3 |
| | W1 → T1<br>W1 → T2<br>W1 → T3 | W1 → T1<br>W2 → T2<br>W1 → T3 | W1 → T1<br>W2 → T2<br>W1 → T3 | W1 → T1<br>W2 → T2<br>W2 → T3 | W1 → T1<br>W2 → T2<br>W1 → T3 | W1 → T1<br>W2 → T2<br>W2 → T3 | W1 → T1<br>W2 → T2<br>W2 → T3 | W1 → T1<br>W2 → T2<br>W2 → T3 |
| 010 | T2 → T1<br>T2 → T3 | T1 → T2<br>T2 → T1<br>T2 → T3 | T2 → T1<br>T2 → T3 | T2 → T1<br>T1 → T3 | T3 → T2<br>T2 → T1<br>T2 → T3 | T2 → T1<br>T1 → T2 | T2 → T1 | T2 → T1<br>T1 → T3 |
| | W1 → T1<br>W1 → T2<br>W1 → T3 | W1 → T1<br>W2 → T2<br>W1 → T3 | W1 → T1<br>W2 → T2<br>W2 → T3 | W1 → T1<br>W2 → T2<br>W2 → T3 | W1 → T1<br>W2 → T2<br>W1 → T3 | W1 → T1<br>W2 → T2<br>W2 → T3 | W1 → T1<br>W2 → T2<br>W2 → T3 | W1 → T1<br>W2 → T2<br>W2 → T3 |
| 011 | T1 → T3 | T1 → T2<br>T2 → T3 | T2 → T3 | T2 → T3 | T2 → T3<br>T3 → T2 | T1 → T2<br>T2 → T3 | T2 → T3 | T2 → T3 |
| | W1 → T1<br>W1 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 |
| 100 | T3 → T1<br>T3 → T2 | T1 → T2<br>T3 → T1 | T3 → T1 | T1 → T3<br>T3 → T1 | T3 → T2<br>T3 → T2 | T1 → T2<br>T3 → T1 | T3 → T1 | T3 → T1<br>T1 → T3 |
| | W1 → T1<br>W1 → T2<br>W1 → T3 | W1 → T1<br>W2 → T2<br>W1 → T3 | W1 → T1<br>W2 → T2<br>W1 → T3 | W1 → T1<br>W2 → T2<br>W2 → T3 | W1 → T1<br>W2 → T2<br>W1 → T3 | W1 → T1<br>W2 → T2<br>W2 → T3 | W1 → T1<br>W2 → T2<br>W2 → T3 | W1 → T1<br>W2 → T2<br>W2 → T3 |
| 101 | T1 → T2 | T1 → T2 | | T1 → T3 | T3 → T2 | T1 → T2 | | T1 → T3 |
| | W1 → T1<br>W1 → T2<br>W1 → T3 | W1 → T1<br>W2 → T2<br>W1 → T3 | W1 → T1<br>W2 → T2<br>W1 → T3 | W1 → T1<br>W2 → T2<br>W2 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W2 → T3 |
| 110 | T2 → T1 | T1 → T2<br>T2 → T1 | T2 → T1 | T1 → T3<br>T2 → T1 | T2 → T1<br>T3 → T2 | | T2 → T1 | T2 → T1<br>T1 → T3 |
| | W1 → T1<br>W1 → T2<br>W1 → T3 | W1 → T1<br>W2 → T2<br>W1 → T3 | W1 → T1<br>W2 → T2<br>W1 → T3 | W1 → T1<br>W2 → T2<br>W2 → T3 | W1 → T1<br>W2 → T2<br>W1 → T3 | W1 → T1<br>W2 → T2<br>W2 → T3 | W1 → T1<br>W2 → T2<br>W1 → T3 | W1 → T1<br>W2 → T2<br>W2 → T3 |
| 111 | | T1 → T2<br>T2 → T3 | T2 → T3 | T2 → T3 | T2 → T3<br>T3 → T2 | T2 → T3<br>T1 → T2 | T2 → T3 | T2 → T3 |
| | WT → T1<br>W1 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 | W1 → T1<br>W2 → T2<br>W1 → T3 |

It will be understood that the operations listed in Table V are based on maintaining track T1 as the track being most likely to comprise a correct string of received words. To illustrate the operations listed in Table V, consider the example described above, which corresponds to a set of four ordered pairs of triples: {(G1, G2)}={((0,0,1),(0,1,0)); ((1, 0,1), (0,1,0)); ((0,0,1), (1,1,0)); ((1,0,1), (1,1,0))}. Inspection of the four cells of Table V corresponding to the ordered pairs shows that the actions carried out correspond to those described above in the example. Actions listed for other cells of Table V are generated in a generally similar manner as those described for the cells of the example.

In a final step 170, processor 152 outputs as a final decision the word that is in track T1.

It will be understood that the principles of the present invention may be applied to correcting erroneous words which have been encoded in formats other than the 8b/10b format described above, or that may not be encoded, and for correcting errors in words which have one or more incorrect bits. It will be further understood that while the preferred embodiments described above use three sequences of stored words, other numbers of sequences may also be used. For example, the number of sequences may be set to four, so that there are two reserve sequences, each of which may have either word W1 or W2 inserted. All such numbers are assumed to be comprised within the scope of the present invention.

In an alternative preferred embodiment of the present invention error, correction block 150 does not receive two words W1 and W2 from symbol alignment block 34. Rather block 150 receives one word, preferably W1, from block 34 and a single bit quality value Q (FIG. 6). Most preferably, the single bit quality value is in the form of a flag assigned to a specific bit in the word received by block 150 whose quality has been assessed and which is considered to be problematic on the basis of the assessment. It will be appreciated that in performing their tasks, both selector 28 and corrector 32 are able to generate a measure of the quality of each single bit they analyze. For example, if single bit corrector 32 does perform a correction using condition (8), the bit value output from the corrector may be considered to have a high probability of being correct. Thus the bit quality of the bit value output is high, and correspondingly, a bit quality for the opposite bit value for this bit is low. Those skilled in the art will be able to assign a bit quality for bits output from selector 28.

Preferably, if the bit quality is outside a predetermined value, so indicating that the bit may not be correct and that the bit is problematic, bit quality Q is input to error correction block 150, most preferably by setting the flag if implemented. If the bit quality is within the predetermined value, so that the corresponding bit is assumed to be correct, no bit quality value is input to block 150, and the flag is not set.

Block 150 uses the bit quality and the symbol associated with the bit to construct a second word W2. Process 160, as described above with respect to FIGS. 7 and 8, is then applied to W1 and W2.

As stated above, since clock 14 is not locked to a transmit clock of the incoming signal, the sampling positions of sampling phase sets A, B, C, D, (FIG. 2) may drift relative to data stream 50. As the positions drift, they effectively scan across the data stream. The scanning, and the fact that a single value of G(p,t) (equation (6)) acts as a weighted average of signal levels at three adjacent phases, are used by preferred embodiments of the present invention to implement a signal quality indicator 27 (FIG. 1). The signal quality indicator may be advantageously used in place of specialized signal quality measurement equipment such as that described in the Background of the Invention. Signal quality indicator 27 receives its inputs, an index D1 of the main phase and a grade G(p,t) of that phase, from main phase selector 28.

Figure 9:
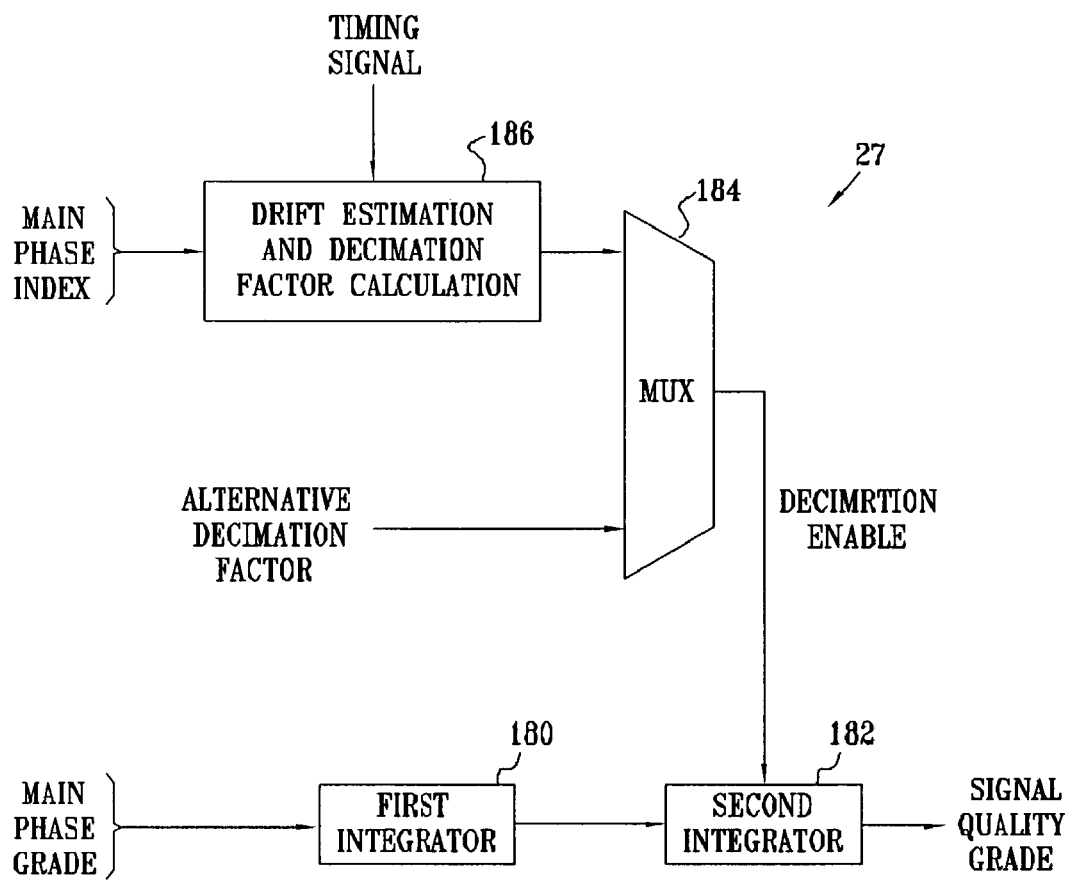
FIG. 9 is a schematic block diagram of a signal quality indicator (SQI), according to a preferred embodiment of the present invention.

FIG. 9 is a schematic block diagram of signal quality indicator (SQI) 27, according to a preferred embodiment of the present invention. SQI 27 comprises a first leakage integrator 180 in series with a second leakage integrator 182. Both integrators integrate their respective inputs so as to effectively smooth them. Leakage integrator 182 may be activated by an enable signal generated by a multiplexer 184, so that in addition to integrating its input, decimation may be performed on the output of SQI 27. The enable signal for the decimation is derived from a multiplexer 184, which activates the enable signal according to a decimation factor received by the multiplexer.

The decimation factor is most preferably generated automatically by a drift estimation block 186. Block 186 receives, from main phase selector 28, the phase value that has been selected as the main phase. Block 186 also receives a timing signal, preferably generated from clock 14, which enables the block to determine a duration of time for which a specific phase is the main phase. During operation of deserializer 10 the main phase changes because of drift of the sampling phase sets, as described above. Block 186 measures a "phase time" during which a specific phase of the sampling phase sets is chosen as the main phase. The measured phase time is approximately inversely proportional to a "drift speed" of the sampling phases on the data stream.

In order to scan across the data stream at a rate which is approximately independent of drift speed, block 186 preferably sets the decimation factor to be approximately inversely proportional to the drift speed, so that the lower the drift speed the higher the decimation factor. Block 186 thus preferably sets the decimation factor to be directly proportional to the phase time. In a preferred example of the present invention, Block 186 automatically sets the decimation factor so that eight samples are taken from a specific phase, i.e., during the phase time. Optionally, multiplexer 184 may also receive an alternative decimation factor, which may be input directly to the multiplexer from an operator of SQI 27. Such an operator input may be used, for example, in a case where the drift speed is very low or even substantially zero.

Figure 10:
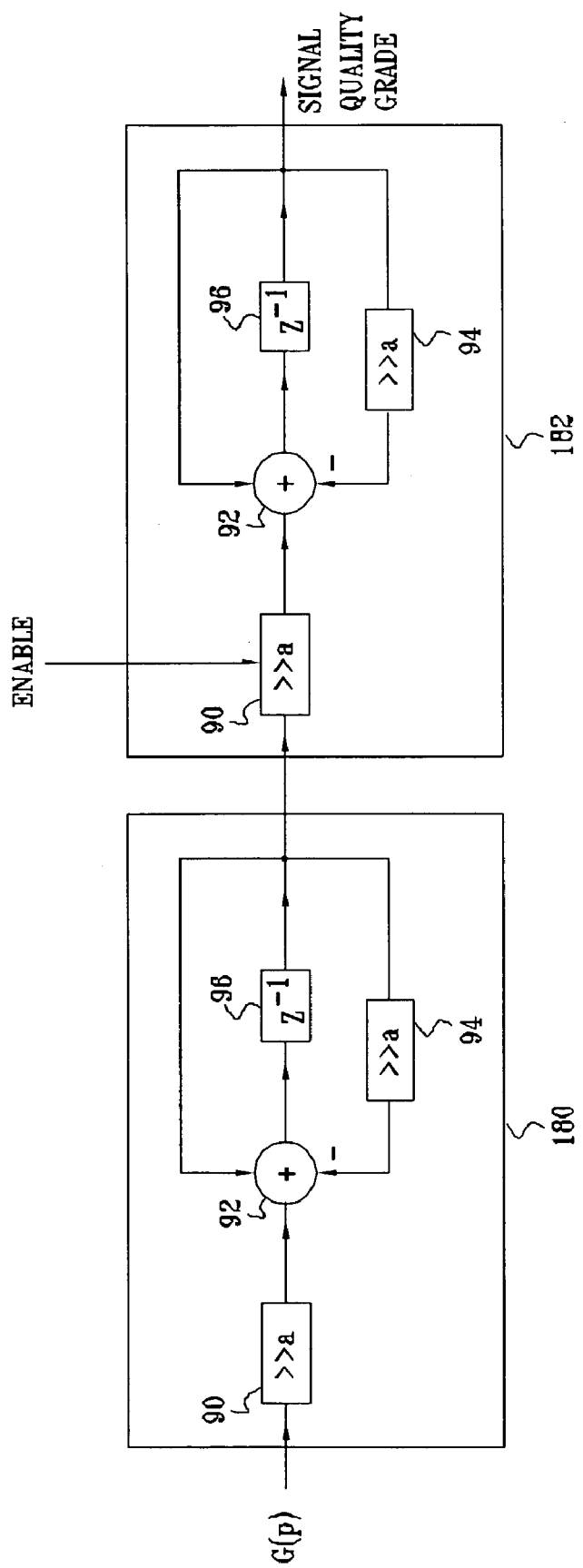
FIG. 10 is a schematic block diagram of leakage integrators, according to a preferred embodiment of the present invention.

FIG. 10 is a schematic block diagram of leakage integrators 180, 182, according to a preferred embodiment of the present invention. Apart from the differences described below, the operation of integrators 180 and 182 is generally similar to that of integrator 26 (FIG. 4), so that elements indicated by the same reference numerals in integrators 26, 180, and 182 are generally identical in construction and in operation. In integrators 180 and 182, shifters 90 and 94 preferably shift their input to the right by 6, the value effectively controlling the size of a "sliding window" over which samples are integrated. Unlike integrator 26, neither of integrators 180, 182 have a fixed point converter 98 at their output. Integrator 182 also receives an enable input to shifter 90, so that the shifter is activated according to the decimation factor used by multiplexer 184, and so that integrator 182 performs its integration only when enabled. Integrator 182 outputs a final signal quality grade.

The combination of two integrators in series, the second having decimation, gives sufficient averaging to substantially eliminate noise effects and also effectively scan across each bit of the incoming data. The two integrators give more flexible and better control of integration parameters, as well as using less hardware than an equivalent single integrator providing the same functions as the two integrators.

Measurements of the signal quality grade are preferably made on incoming signals having the same data, for example, random idle signals. Such measurements on the same data may be performed, for example, during initial setup and adjustment of deserializer 10 and its incoming lines, when a remote transmitter may be requested to transmit specific data.

FIG. 11 shows schematic graphs of values of the final signal quality grade for different input signals, according to a preferred embodiment of the present invention. Five different input signals were simulated and input to deserializer 10. The five signals had different qualities, as determined by an eye opening measurement based on the system described in the Background of the Invention. Graphs 202, 204, 206, 208, and 210 show values of the signal quality grade, as measured by SQI 27, vs. time. It is seen that the grades for each input signal stabilize to a substantially constant value. Furthermore, the values obtained are substantially independent of the rate of decimation introduced in integrator 182, and of the drift speed, even when the latter is very low or substantially zero. Table VI shows the stabilized grade values, from SQI 27 for the different input signals, together with the eye opening measurement for the signals.

TABLE VI

| Graph | Stabilized Signal Quality Grade | Eye Opening Value |
|---|---|---|
| 202 | 0.47 | 0.427 |
| 204 | 0.64 | 0.490 |
| 206 | 0.65 | 0.494 |
| 208 | 0.72 | 0.525 |
| 210 | 0.72 | 0.526 |

Graph 212 plots the stabilized signal quality grades vs. the eye opening values. It is seen both from Table VI and from graph 212 that there is a substantially linear relationship between the signal quality grades and the eye opening values, so that the grades provide a good metric of the signal quality.

Figure 12:
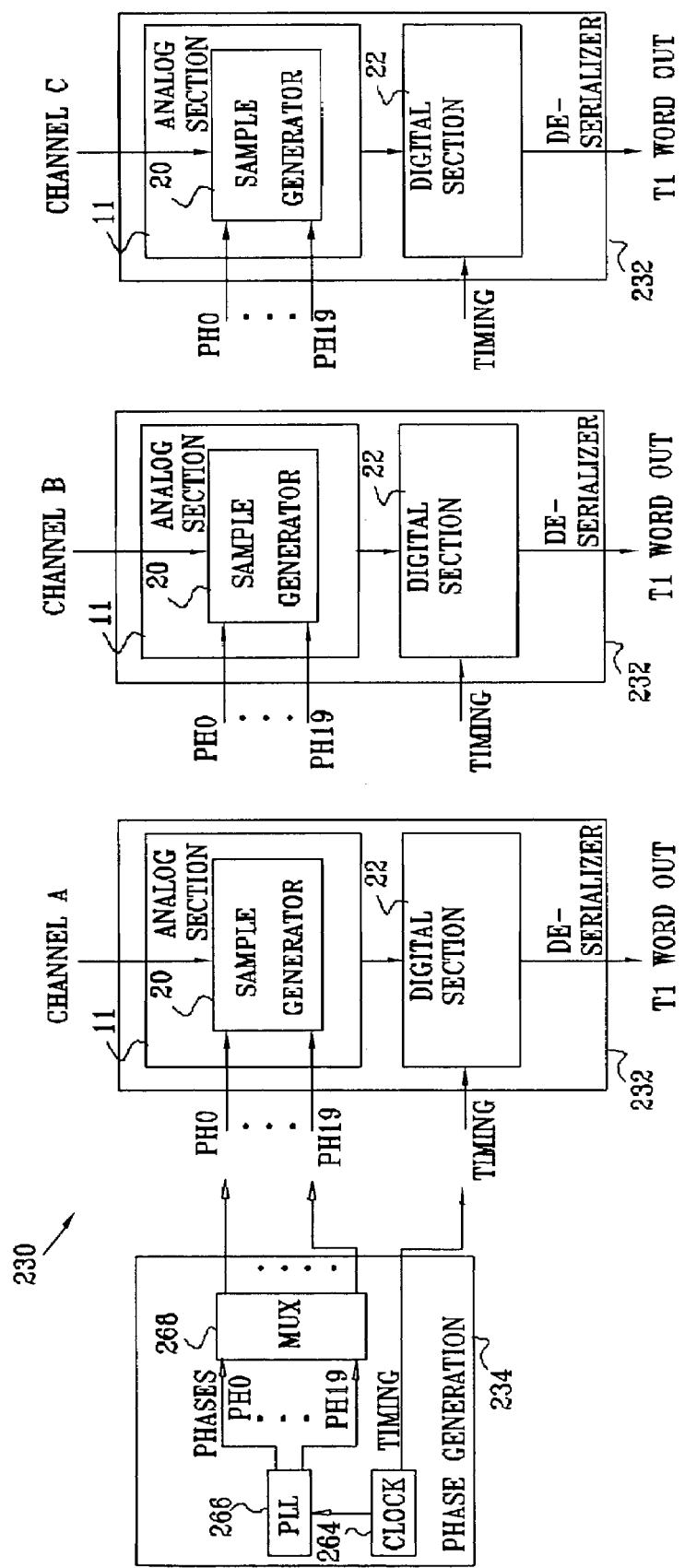
FIG. 12 is a schematic block diagram of a multi-channel deserializer, according to a preferred embodiment of the present invention.

FIG. 12 is a schematic block diagram of a multi-channel deserializer 230, according to a preferred embodiment of the present invention. Multi-channel deserializer 230 comprises a plurality of separate deserializers 232. Apart from the differences described below, the operation of each deserializer 232 is generally similar to that of deserializer 10, so that elements indicated by the same reference numerals in both deserializers 10 and 232 are generally identical in construction and in operation. Preferably, none of analog sections 11 of deserializers 232 have clock 14, PLL oscillator 16, or multiplexer 18. Rather multi-channel deserializer 230 comprises a phase generation block 234, comprising a single clock 264, a PLL oscillator 256, and a multiplexer 268, respectively substantially similar to clock 14, PLL oscillator 16, and multiplexer 18. Block 234 provides twenty phases ph0, ph19, substantially as described above with reference to FIG. 1, to each of sample generators 20 in deserializers 232, and general timing signals to each of their digital circuitry 22. Alternatively, instead of phase generation block 234, one of analog sections 11 in a specific deserializer 232 comprises single clock 264, PLL oscillator 256, and multiplexer 268, which generate the twenty phases and general timing signals for the deserializer, and which provide the twenty phases and timing signals to the other analog sections 11 and digital circuitry sections 22 respectively of the other deserializers 232.

Each deserializer 232 receives a channel A, B, C, of data, and de-serializes its respective data stream substantially as described above for deserializer 10. It will be appreciated that multi-channel deserializer 230 is able to deserialize substantially any number of channels of incoming serial data, one deserializer 232 for each channel, using only one PLL clock. Multi-channel deserializer 230 thus saves significant numbers of components, as well as significantly reducing the complexity and difficulty of their arrangement, compared to multi-channel deserializers comprising more than one PLL clock, typically one per channel plus a synchronizing PLL clock, and which may also require elastic buffers. It will be appreciated that multi-channel deserializers such as deserializer 230, when implemented on a single die, have significant improvements in yields compared to deserializers having multiple PLL clocks, since any single PLL failure leads to failure of the whole deserializer. Furthermore, it will be apparent that there is no requirement to synchronize the one PLL clock of multi-channel deserializer 230 to the incoming data channels, and that the incoming data channels to the deserializer may be transmitted with different clocks.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A receiver for deserializing a stream of consecutive data bits having a bit period, comprising:
   a single clock which is adapted to generate a first plurality of clock phases;
   a sample generator which is adapted to sample the stream so as to generate initial data values of each of the consecutive data bits at times defined by the first plurality of clock phases; and
   digital circuitry which is adapted to:
   group the initial data values into a second plurality of sampling phase sets, according to the clock phases at which the values were sampled,
   assign each of the sampling phase sets a respective grade responsive to at least some of the initial data values,
   select a decoding phase set from the sampling phase sets responsive to the respective grades, and
   decode the stream responsive to the initial data values of the decoding phase set to generate decoded values of the consecutive bits,
   wherein the single clock comprises a free-running clock driving a phase locked loop (PLL) oscillator having an oscillation period independent of the bit period.

2. A receiver according to claim 1, wherein the first plurality of phases have a substantially equal separation in time from each other.

3. A receiver according to claim 2, wherein the separation in time is an integral sub-multiple of the oscillation period.

4. A receiver according to claim 1, wherein the digital circuitry comprises a second plurality of initial grading modules which each assign the respective sampling phase sets the respective grade.

5. A receiver according to claim 4, wherein the digital circuitry comprises a second plurality of integrator blocks which each receive an output from the respective initial grading modules, and which integrate the output over time.

6. A receiver according to claim 4, wherein the digital circuitry comprises a main phase selector which selects the decoding phase set as the sampling phase set having a highest value of the grade.

7. A receiver according to claim 4, wherein the initial grading module comprises a third plurality of substantially similar circuits, each circuit being implemented to determine a partial sum of the respective grade.

8. A receiver according to claim 7, wherein the partial sum is evaluated by a predetermined function receiving values generated by three or more consecutive bits comprised in the stream of consecutive bits.

9. A receiver according to claim 7, wherein the initial grading module sums the partial sum of each circuit to generate a temporal grade as an output of the module.

10. A receiver according to claim 1, wherein the digital circuitry comprises a single bit corrector which overwrites the decoded value of one of the consecutive bits responsive to the decoded value and to at least one of the decoded values of the consecutive bit preceding the one of the consecutive bits and the consecutive bit following the one of the consecutive bits.

11. A receiver according to claim 10, wherein the single bit corrector overwrites the decoded value responsive to a comparison between the decoded value and the initial data value of the one of the consecutive bits determined at a phase different from the sampling phase set of the one of the consecutive bits.

12. A receiver according to claim 1, wherein the digital circuitry comprises a symbol alignment block which receives the decoded values of the consecutive bits and which is adapted to generate a symbol from the decoded values and to determine boundaries of the symbol.

13. A method for deserializing a stream of consecutive data bits having a bit period, comprising:
   sampling each of the consecutive data bits at times defined by a first plurality of clock phases generated by a single receiver clock so as to generate initial data values of each of the consecutive data bits;
   grouping the initial data values into a second plurality of sampling phase sets, according to the clock phases at which the values were sampled;
   assigning each of the sampling phase sets a respective grade responsive to at least some of the initial data values;

selecting a decoding phase set from the sampling phase sets responsive to the respective grades; and decoding the stream responsive to the initial data values of the decoding phase set to generate decoded values of the consecutive bits, wherein the single receiver clock comprises a free-running clock driving a phase locked loop (PLL) oscillator having an oscillation period independent of the bit period.

14. A method according to claim 13, wherein the first plurality of phases have a substantially equal separation in time from each other.

15. A method according to claim 14, wherein the separation in time is an integral sub-multiple of the oscillation period.

16. A method according to claim 13, wherein assigning each of the sampling phase sets a respective grade comprises providing a second plurality of initial grading modules which each assign the respective sampling phase sets the respective grade.

17. A method according to claim 16, and comprising receiving an output from each of the respective initial grading modules and integrating the output over time.

18. A method according to claim 13, wherein selecting the decoding phase set from the sampling phase sets comprises selecting the decoding phase set as the sampling phase set having a highest value of the grade.

19. A method according to claim 13, and comprising determining a partial sum of the respective grade.

20. A method according to claim 19, wherein determining the partial sum comprises receiving values generated by three or more consecutive bits comprised in the stream of consecutive bits and evaluating the partial sum by a predetermined function responsive to the received values.

21. A method according to claim 19, and comprising summing the partial sums to generate a temporal grade.

22. A method according to claim 13, and comprising overwriting the decoded value of one of the consecutive bits responsive to the decoded value and to at least one of the decoded values of the consecutive bit preceding the one of the consecutive bits and the consecutive bit following the one of the consecutive bits.

23. A method according to claim 22, wherein overwriting the decoded value comprises overwriting the decoded value responsive to a comparison between the decoded value and the initial data value of the one of the consecutive bits determined at a phase different from the sampling phase set of the one of the consecutive bits.

24. A method according to claim 13, and comprising determining boundaries between symbols comprised in the decoded values.

25. A receiver for deserializing data conveyed on a first plurality of channels, comprising:

a single clock which is adapted to generate a second plurality of clock phases; and a first plurality of deserializers, respectively coupled to the first plurality of channels so as to receive a respective data stream as consecutive data bitshaving a bit period, each deserializer comprising:

a sample generator which is adapted to sample the respective data stream so as to generate initial data values of each of the consecutive data bits at times defined by the second plurality of clock phases; and digital circuitry which is adapted to:

group the initial data values into a third plurality of sampling phase sets, according to the clock phases at which the values were sampled, assign each of the sampling phase sets a respective grade responsive to at least some of the initial data values, select a decoding phase set from the sampling phase sets responsive to the respective grades, and decode the respective data stream responsive to the initial data values of the decoding phase set to generate decoded values of the consecutive bits, wherein the single clock comprises a free-running clock driving a phase locked loop (PLL) oscillator having an oscillation period independent of the bit period.

26. A receiver according to claim 25, wherein one of the deserializers comprises the single clock.

27. A receiver according to claim 25, wherein each of the first plurality of deserializers is adapted to generate a first plurality of symbols from the decoded values.

28. A method for deserializing data conveyed on a first plurality of channels, comprising:

generating a second plurality of clock phases from a single clock;

conveying the second plurality of clock phases to a first plurality of deserializers; and coupling the first plurality of deserializers to the first plurality of channels so as to receive therefrom a respective data stream as consecutive data bits having a bit period, each deserializer comprising:

a sample generator which is adapted to sample the respective data stream so as to generate initial data values of each of the consecutive data bits at times defined by the second plurality of clock phases, and digital circuitry which is adapted to:

group the initial data values into a third plurality of sampling phase sets, according to the clock phases at which the values were sampled, assign each of the sampling phase sets a respective grade responsive to at least some of the initial data values, select a decoding phase set from the sampling phase sets responsive to the respective grades, and decode the respective data stream responsive to the initial data values of the decoding phase set to generate decoded values of the consecutive bits, wherein the single clock comprises a free-running clock driving a phase locked loop (PLL) oscillator having an oscillation period independent of the bit period.

29. A method according to claim 28, wherein one of the deserializers comprises the single clock.

30. A method according to claim 28, and comprising each of the first plurality of deserializers generating a first plurality of symbols from the decoded values.

* * * * *